(12) United States Patent
Murakami et al.

(10) Patent No.: US 9,337,003 B2
(45) Date of Patent: May 10, 2016

(54) PLASMA PROCESSING APPARATUS AND CONSTITUENT PART THEREOF

(75) Inventors: Takahiro Murakami, Nirasaki (JP); Toshikatsu Wakaki, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 1098 days.

(21) Appl. No.: 12/613,703

(22) Filed: Nov. 6, 2009

(65) Prior Publication Data

US 2010/0116437 A1     May 13, 2010

Related U.S. Application Data

(60) Provisional application No. 61/163,488, filed on Mar. 26, 2009.

(30) Foreign Application Priority Data

Nov. 7, 2008 (JP) ................. 2008-286685

(51) Int. Cl.
*H01J 37/32* (2006.01)
*H01L 21/306* (2006.01)

(52) U.S. Cl.
CPC ..... *H01J 37/32541* (2013.01); *H01J 37/32477* (2013.01)

(58) Field of Classification Search
USPC ...... 118/715, 722, 723 R, 723 E; 156/345.43, 156/345.44, 345.45, 345.46, 345.47
See application file for complete search history.

(56) References Cited

U.S. PATENT DOCUMENTS

| | | | | |
|---|---|---|---|---|
| 5,472,565 A | * | 12/1995 | Mundt et al. | 216/71 |
| 5,919,332 A | * | 7/1999 | Koshiishi et al. | 156/345.47 |
| 5,942,075 A | * | 8/1999 | Nagahata et al. | 156/345.47 |
| 5,981,899 A | * | 11/1999 | Perrin et al. | 219/121.52 |
| 6,074,518 A | | 6/2000 | Imafuku et al. | |
| 7,513,214 B2 | * | 4/2009 | Okumura et al. | 118/723 E |
| 2002/0187647 A1 | * | 12/2002 | Dhindsa et al. | 438/710 |
| 2005/0011453 A1 | * | 1/2005 | Okumura et al. | 118/723 E |
| 2006/0037701 A1 | * | 2/2006 | Koshiishi et al. | 156/345.44 |
| 2006/0066247 A1 | | 3/2006 | Koshiishi et al. | |
| 2006/0219363 A1 | | 10/2006 | Matsumoto et al. | |

(Continued)

FOREIGN PATENT DOCUMENTS

| | | |
|---|---|---|
| CN | 1723528 A | 1/2006 |
| JP | 9-69400 A | 3/1997 |
| JP | 2006-270019 A | 10/2006 |

(Continued)

OTHER PUBLICATIONS

Chinese Office Action issued Aug. 3, 2011, in Patent Application No. 200910207951.5 (with English-language translation).

*Primary Examiner* — Parviz Hassanzadeh
*Assistant Examiner* — Margaret D Klunk
(74) *Attorney, Agent, or Firm* — Rothwell, Figg, Ernst & Manbeck, P.C.

(57) ABSTRACT

A constituent part is included in a plasma processing apparatus for performing a plasma process on a substrate mounted on a susceptor by using a plasma generated in a processing chamber. The constituent part has at least one recessed corner formed by intersection of two surfaces. The recessed corner is exposed to the plasma when the plasma is generated in the processing chamber. An intersection angle of the two surfaces seen from a plasma side is 115 degrees to 180 degrees.

3 Claims, 7 Drawing Sheets

(56) References Cited

U.S. PATENT DOCUMENTS

2007/0187038 A1 8/2007 Ren et al.
2009/0242133 A1 10/2009 Nakayama et al.

FOREIGN PATENT DOCUMENTS

JP          2009-239014       10/2009
KR     10-2006-0105670 A      10/2006

* cited by examiner

_US 9,337,003 B2_

PLASMA PROCESSING APPARATUS AND CONSTITUENT PART THEREOF

CROSS-REFERENCE TO RELATED APPLICATIONS

This application claims priority to Japanese Patent Application No. 2008-286685 filed on Nov. 7, 2008, the entire contents of which are incorporated herein by reference.

FIELD OF THE INVENTION

The present invention relates to a plasma processing apparatus and a constituent part thereof; and more particularly, to a constituent part, which is exposed to a plasma of a plasma processing apparatus.

BACKGROUND OF THE INVENTION

A plasma processing apparatus includes an accommodation chamber accommodating a wafer serving as a substrate. The plasma processing apparatus generates a plasma from a processing gas introduced into the accommodation chamber and performs a desired plasma process on the wafer by using the plasma. When the plasma process is a dry etching process, reaction products are produced from the reaction between the plasma and an etched material. The reaction products are deposited as deposits on the surface of a constituent part of the accommodation chamber.

On the other hand, a sheath 71 is generated along a surface 70 of a constituent part exposed to the plasma in the accommodation chamber, and ions 72 in the plasma are implanted toward the surface of the constituent part by the sheath 71 (see FIG. 7A). The implanted ions 72 sputter the deposits deposited on the surface of the constituent part to remove the deposits from the surface of the constituent part. Generally, the amount of the deposits deposited on the surface of the constituent part is equal to or less than the amount of the deposits removed by ion sputtering, so that the deposits are rarely deposited.

In recent years, precise control over the distribution of a plasma, particularly, the density of electrons in the accommodation chamber has been required to achieve uniformity in the plasma process performed on the wafer. Correspondingly, the provision of a protrusion, a groove, or a step at an upper electrode facing the wafer has been proposed (see, e.g., Patent Document 1).

[Patent Document 1] Japanese Patent Application Publication No. 2009-239014

As shown in FIG. 7B, a bent sheath 74 is generated at a protrusion or a groove having a corner 73 of an approximately right angle. However, ions 75 are created approximately perpendicularly to the sheath 74, and therefore, the ions 75 are created from the bent sheath 74 in a diffused manner. As a result, the number of ions 75 implanted into the corner 73 per unit area is much less than in the other regions, and the amount of deposits removed by ion sputtering is reduced. Accordingly, deposits 76 may be deposited at the corner 73 and in the vicinity thereof. The deposited deposits 76 are peeled off into particles, which are attached to a wafer to cause wafer defects.

SUMMARY OF THE INVENTION

In view of the above, the present invention provides a constituent part capable of preventing deposits from being deposited at a recessed corner of the constituent part and a plasma processing apparatus including the same.

In accordance with a first aspect of the present invention, there is provided a constituent part of a plasma processing apparatus for performing a plasma process on a substrate mounted on a susceptor by using a plasma generated in a processing chamber, the constituent part comprising: at least one recessed corner formed by intersection of two surfaces, wherein the recessed corner is exposed to the plasma when the plasma is generated in the processing chamber and an intersection angle of the two surfaces seen from a plasma side is 115 degrees to 180 degrees.

In accordance with a second aspect of the present invention, there is provided a plasma processing apparatus for performing a plasma process on a substrate mounted on a susceptor by using a plasma generated in a processing chamber, comprising: a constituent part having at least one recessed corner formed by intersection of two surfaces, wherein the recessed corner is exposed to the plasma when the plasma is generated in the processing chamber and an intersection angle of the two surfaces seen from a plasma side is 115 degrees to 180 degrees.

BRIEF DESCRIPTION OF THE DRAWINGS

The objects and features of the present invention will become apparent from the following description of embodiments, given in conjunction with the accompanying drawings, in which:

FIGS. 5A and 5B illustrate a relationship between a groove of the constituent part and the form of a sheath generated, wherein FIG. 5A is a cross sectional view when the width of the groove is extremely small, and FIG. 5B is a cross sectional view when the width of a groove is not very large;

FIGS. 7A and 7B explain the diffusion of ions created from a sheath generated along the surface of a constituent part of a conventional plasma processing apparatus, wherein FIG. 7A is a view when there is no corner, and FIG. 7B is a view when there is a corner of an approximately right angle.

DETAILED DESCRIPTION OF THE EMBODIMENTS

Hereinafter, embodiments of the present invention will be described in detail with reference to the accompanying drawings which form a part hereof.

Figure 1:
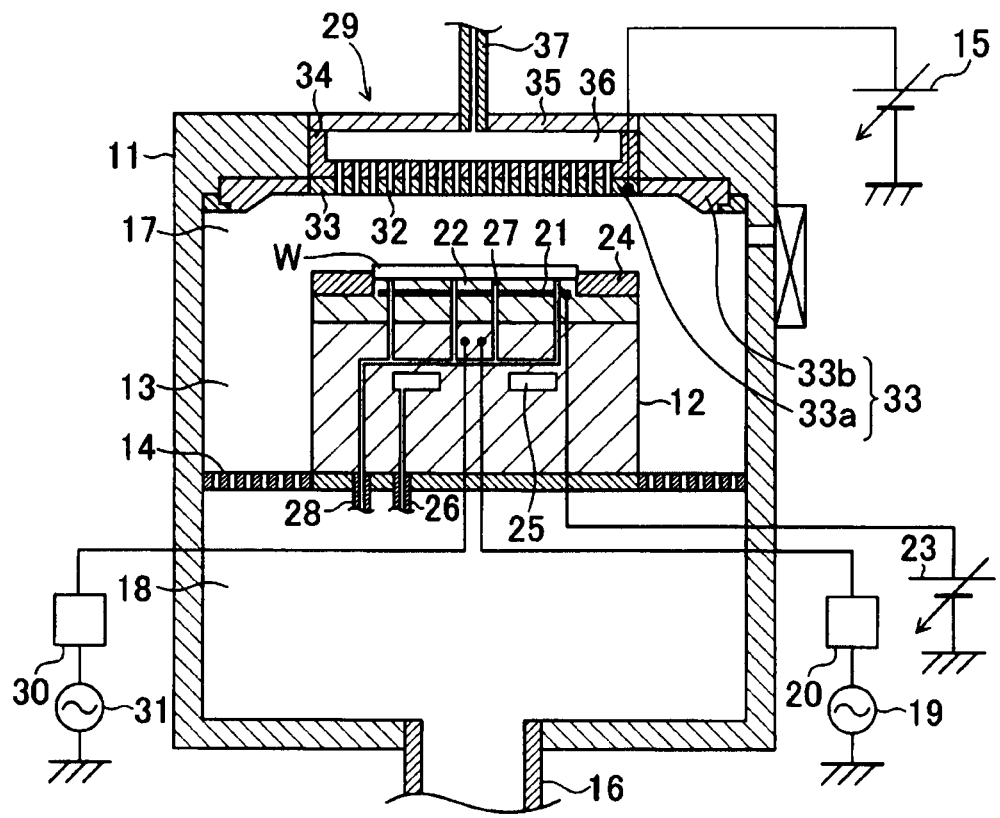
FIG. 1 is a cross sectional view schematically illustrating a configuration of a plasma processing apparatus including a constituent part in accordance with an embodiment of the present invention.

FIG. 1 is a cross sectional view schematically illustrating a configuration of a plasma processing apparatus including a constituent part in accordance with an embodiment of the present invention. This plasma processing apparatus is configured to perform a dry etching process on a wafer.

As shown in FIG. 1, the plasma processing apparatus 10 includes a chamber 11 accommodating a wafer W having a diameter of, e.g., 300 mm. A cylindrical susceptor 12 for mounting thereon the wafer W for semiconductor devices is disposed in the chamber 11. Further, in the plasma processing apparatus 10, a side exhaust passageway 13 is defined by an inner wall of the chamber 11 and a side surface of the susceptor 12 to discharge gas above the susceptor 12 out of the chamber 11. A gas exhaust plate 14 is disposed in the middle of the side exhaust passageway 13.

The gas exhaust plate 14 is a plate-shaped member having a plurality of holes. The gas exhaust plate 14 serves as a partition plate to partition an inner space of the chamber 11 into upper and lower portions. A plasma is generated in the upper inner portion (hereinafter, referred to as a "reaction room") 17 of the chamber 11 partitioned by the gas exhaust plate 14. Further, a gas exhaust pipe 16, through which gas is discharged out of the chamber 11, is connected to the lower inner portion (hereinafter, referred to as a "gas exhaust room (manifold)") 18 of the chamber 11. The gas exhaust plate 14 catches or reflects the plasma generated in the reaction room 17 to prevent leakage of the plasma to the manifold 18.

A turbo molecular pump (TMP) (not shown) and a dry pump (DP) (not shown) are connected to the gas exhaust pipe 16. These pumps evacuate the chamber 11 to reduce an inner pressure of the chamber 11. Specifically, the DP reduces the inner pressure of the chamber 11 from an atmospheric pressure to a medium vacuum pressure (e.g., $1.3 \times 10$ Pa (0.1 Torr) or less). The TMP cooperates with the DP to reduce the inner pressure of the chamber 11 to a high vacuum pressure (e.g., $1.3 \times 10^{-3}$ Pa ($1.0 \times 10^{-5}$ Torr) or less), which is lower than the medium vacuum pressure. Further, the inner pressure of the chamber 11 is controlled by an automatic pressure control (APC) valve (not shown).

A first high frequency power supply 19 is connected to the susceptor 12 in the chamber 11 via a first matching unit 20. Also, a second high frequency power supply 31 is connected to the susceptor 12 in the chamber 11 via a second matching unit 30. The first high frequency power supply 19 supplies a high frequency power for ion attraction, which has a relatively low frequency, to the susceptor 12. The second high frequency power supply 31 supplies a high frequency power for plasma generation, which has a relatively high frequency, to the susceptor 12. Accordingly, the susceptor 12 functions as an electrode. Further, the first matching unit 20 and the second matching unit 30 reduce the amount of the high frequency power reflected from the susceptor 12 to maximize the supply efficiency of the high frequency power to the susceptor 12.

An electrostatic chuck 22 having an electrostatic electrode plate 21 therein is disposed on the susceptor 12. The electrostatic chuck 22 includes a lower disc-shaped member having a predetermined diameter and an upper disc-shaped member disposed on the lower disc-shaped member and having a smaller diameter than the lower disc-shaped member. Further, the electrostatic chuck 22 is made of ceramics.

A first DC power supply 23 is connected to the electrostatic electrode plate 21 of the electrostatic chuck 22. When a positive DC voltage is applied to the electrostatic electrode plate 21, a negative potential is generated at a surface of the wafer W facing the electrostatic chuck 22 (hereinafter, referred to as a "backside surface"). Accordingly, a potential difference occurs between the electrostatic electrode plate 21 and the backside surface of the wafer W, and the wafer W is attracted to and held on the upper disc-shaped member of the electrostatic chuck 22 by a Coulomb force or Johnsen-Rahbek force caused by the potential difference.

Further, a ring-shaped member, i.e., a focus ring 24, is mounted on the electrostatic chuck 22 to surround the wafer W attracted thereto. The focus ring 24 is made of a conductor, e.g., single crystalline silicon which is the same as a material of the wafer W. Since the focus ring 24 is made of the conductor, a plasma distribution region is extended to above the focus ring 24 as well as above the wafer W such that the density of a plasma at a peripheral portion of the wafer W is approximately equal to the density of a plasma at a central portion of the wafer W. Consequently, it is possible to maintain the uniformity of a dry etching process carried out on the entire surface of the wafer W.

An annular coolant path 25 is formed in the susceptor 12, e.g., in the circumferential direction. A low temperature coolant, e.g., cooling water or Garden (registered trademark), is supplied from a chiller unit (not shown) to the coolant path 25 via a coolant line 26 in a circulating manner. The susceptor 12 cooled by the low temperature coolant cools the wafer W and the focus ring 24 through the electrostatic chuck 22.

A plurality of heat transfer gas supply holes 27 are formed at a top surface of the upper disc-shaped member of the electrostatic chuck 22 to which the wafer W is attracted (hereinafter, referred to as an "attracting surface"). The heat transfer gas supply holes 27 are connected to a heat transfer gas supply unit (not shown) via a heat transfer gas supply line 28. The heat transfer gas supply unit supplies a heat transfer gas, i.e., helium (He) gas, to a gap between the attracting surface and the backside surface of the wafer W through the heat transfer gas supply holes 27. The helium gas supplied to the gap between the attracting surface and the backside surface of the wafer W efficiently transfers heat from the wafer W to the electrostatic chuck 22.

A shower head 29 is disposed at a ceiling portion of the chamber 11 to face the susceptor 12. The shower head 29 includes an upper electrode 33, a cooling plate 34 for detachably suspending the upper electrode 33, and a cover 35 for covering the cooling plate 34. A buffer room 36 is provided on the inside of the cooling plate 34. A processing gas inlet pipe 37 is connected to the buffer room 36.

A second DC power supply 15 is connected to the upper electrode 33 to apply a DC voltage to the upper electrode 33. Further, the upper electrode 33 includes a disc-shaped conductive member, i.e., an inner electrode 33a, having a plurality of gas holes 32 and a ring-shaped conductive member, i.e., an outer electrode 33b (a constituent part), disposed to surround the inner electrode 33a. The outer electrode 33b has a stepped structure in which an outer peripheral portion rather than an inner peripheral portion of the outer electrode 33b protrudes toward a wafer W mounted on the susceptor 12 (hereinafter, referred to as a "mounted wafer W"). The inner peripheral portion and the outer peripheral portion of the outer electrode 33b are connected to each other at an inclined surface of the outer electrode 33b. The inclined surface of the outer electrode 33b is directed toward the peripheral portion of the mounted wafer W.

In the plasma processing apparatus 10, a processing gas supplied to the buffer room 36 from the processing gas inlet pipe 37 is introduced into the reaction room 17 through the gas holes 32. The introduced processing gas is excited and converted into a plasma by the high frequency power for plasma generation applied to the inside of the reaction room 17 from the second high frequency power supply 31 via the susceptor 12. The plasma is attracted toward the mounted wafer W by the high frequency power for ion attraction, which the first high frequency power supply 19 supplies to the susceptor 12, thereby performing an etching process on the wafer W.

Further, in the plasma processing apparatus 10, the second DC power supply 15 applies a negative DC voltage to the upper electrode 33 during a dry etching process. At this time, the upper electrode 33 discharges secondary electrons. However, the inclined surface of the outer electrode 33b is directed toward the peripheral portion of the mounted wafer W. Accordingly, not only the secondary electrons discharged from the inner peripheral portion of the outer electrode 33b but also the secondary electrons discharged from the inclined surface of the outer electrode 33b reach the vicinity of the peripheral portion of the mounted wafer W. Accordingly, it is possible to prevent a reduction in density of the electrons immediately above the peripheral portion of the mounted wafer W, thereby uniformly performing a dry etching process on the entire surface of the mounted wafer W.

Further, the outer electrode 33b has, in addition to the inclined surface, a groove 41 (which will be described later) to control the density of electrons in the vicinity of the mounted wafer W.

The operations of the respective constituent parts of the above-described plasma processing apparatus 10 are controlled based on a program corresponding to a dry etching process by a central processing unit (CPU) of a controller (not shown) included in the plasma processing apparatus 10.

When the plasma processing apparatus 10 performs a dry etching process on the mounted wafer W, reaction products are deposited on the surface of a constituent part of the chamber 11, e.g., the upper electrode 33.

The upper electrode 33 has the stepped structure and also has the groove 41. Accordingly, the upper electrode 33 has a plurality of corners. As described above, however, the amount of deposits removed by ion sputtering may be reduced at a sheath generated along each of the corners, and the deposits may be deposited at each of the corners and in the vicinity thereof.

Therefore, the inventors of the present invention have examined a relationship between the angle of each corner of a constituent part of the chamber, made of silicon, and the wear rate of the constituent part after a dry etching process in order to understand a relationship between the bending degree of each corner and the deposition of deposits at each corner and in the vicinity thereof. As a result, they have fount that the constituent part is surely worn when the angle of each corner seen from the plasma side is 125 degrees or more as shown in a graph of FIG. 2.

The constituent part is worn when the amount of deposits deposited on the surface of the constituent part is greater than the amount of the deposits removed by ion sputtering. Therefore, the inventors have found that, when the angle of each corner seen from the plasma side is 125 degrees or more, it is possible to suppress the reduction in amount of the deposits removed by ion sputtering and to prevent the amount of the deposits from being greater than the amount of the deposits removed by ion sputtering, i.e., the deposition of the deposits. Further, it can be found from the graph of FIG. 2 that, although a wear rate of the constituent part equal to 0 or less means the deposition of the deposits, the amount of the deposits is very small when the angle of each corner seen from the plasma side is 115 degrees or more, and even if the deposits are deposited, the deposits do not cause wafer defects.

Figure 3:
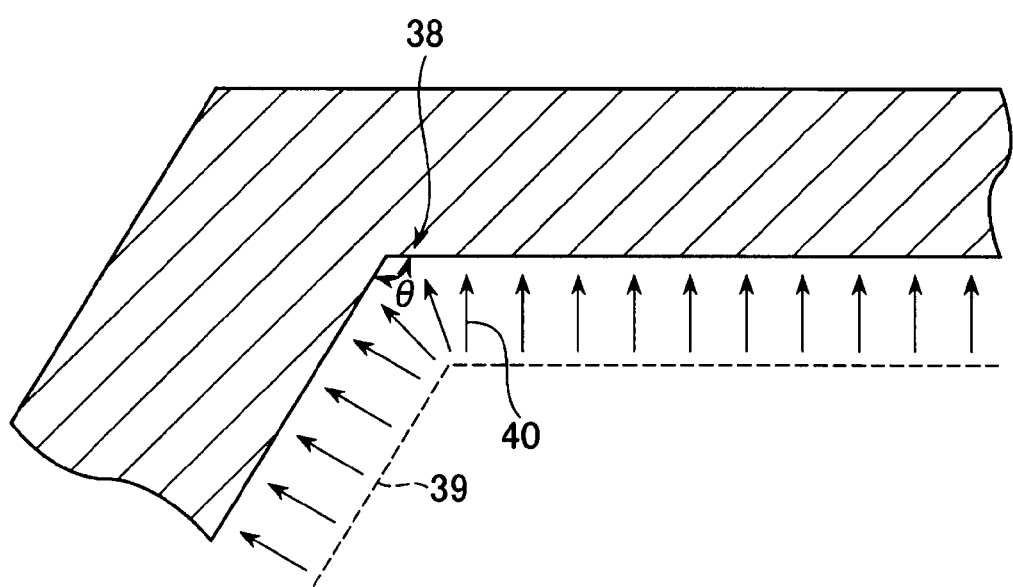
FIG. 3 explains a reduction in diffusion of ions created from a sheath generated along each corner of the constituent part.

From the results of the above examination, the inventors have acquired the following knowledge regarding the removal of the deposits at each corner. That is, when the angle θ of a corner 38 of the constituent part seen from the plasma side is 115 degrees or more, preferably 125 degrees or more, as shown in FIG. 3, the bending degree of a sheath 39 generated along the corner 38 is reduced, and the diffusion of ions 40 created from the sheath 39 is also reduced. As a result, it is possible to prevent the extreme reduction of the number of the ions 40 implanted into the corner 38 per unit area, thereby suppressing the reduction in amount of the deposits removed by ion sputtering.

Figure 2:
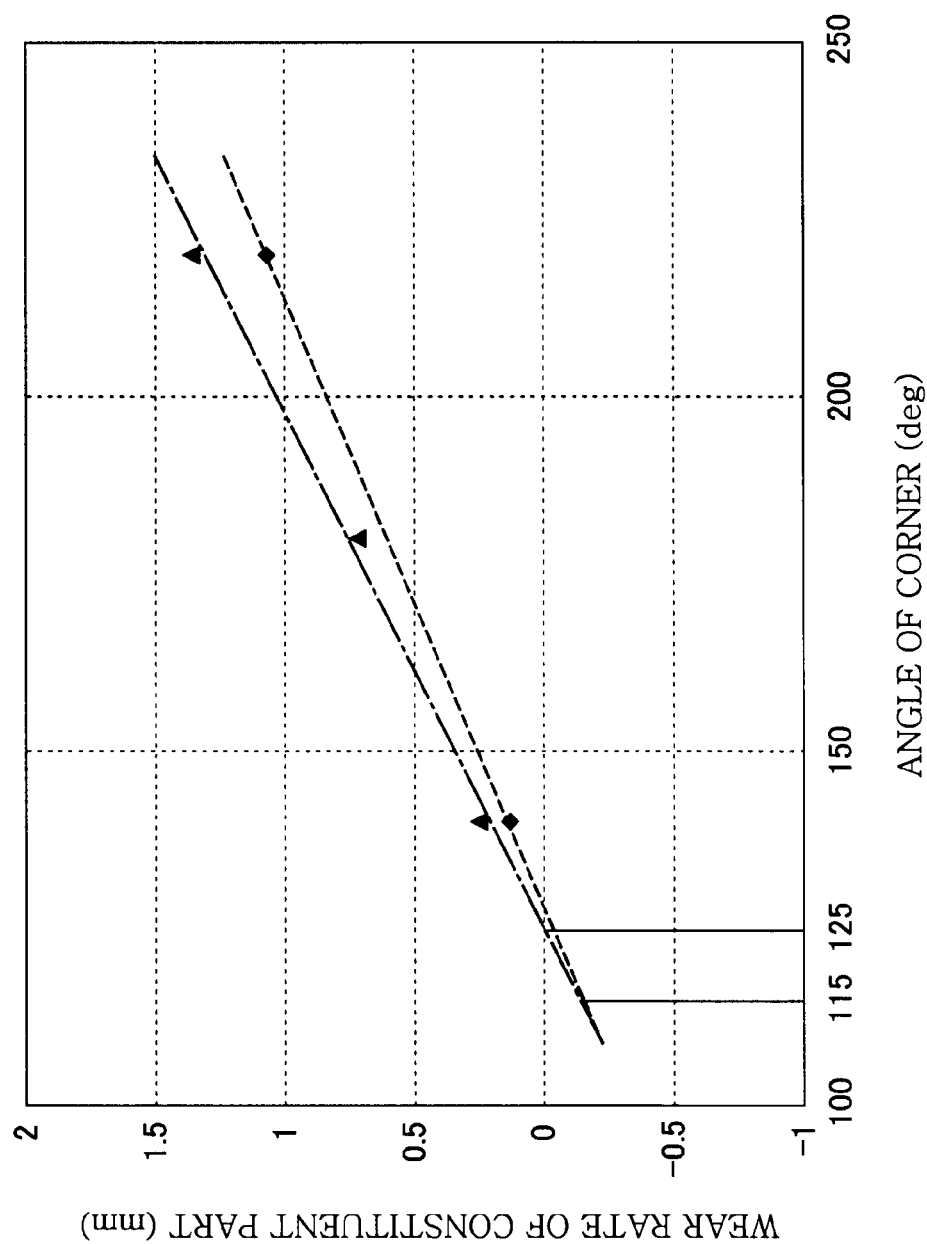
FIG. 2 is a graph illustrating a relationship between the angle of each corner of a constituent part of a chamber of the plasma processing apparatus and the wear rate of the constituent part.

Further, a dashed dotted line and a dashed line in the graph shown in FIG. 2 indicate the results of dry etching processes performed by different plasma processing apparatuses under different conditions, respectively. However, both the lines show that the constituent part is worn when the angle of the corner seen from the plasma side is 125 degrees or more. Accordingly, it could be seen that it is possible to prevent the deposition of the deposits, irrespective of kinds of the plasma processing apparatuses or dry etching process conditions, when the angle of the corner seen from the plasma side is 125 degrees or more.

On the other hand, when the angle of the corner is greater than 180 degrees, the corner is formed as a protruding corner, and a sheath is generated to surround the protruding corner. Accordingly, ions implanted from the sheath are concentrated on the protruding corner, so that the protruding corner is extremely worn. Thus, it is preferable to set the angle of the corner from the plasma side to be smaller than 180 degrees such that the corner is formed as a recessed corner.

In this embodiment, based on the above-mentioned knowledge, the angle of each corner formed by the intersection of two surfaces (intersection angle of two surfaces seen from the plasma side) is set to range from 115 degrees to 180 degrees at the stepped structure or the groove 41 of the outer electrode 33b.

Figure 4:
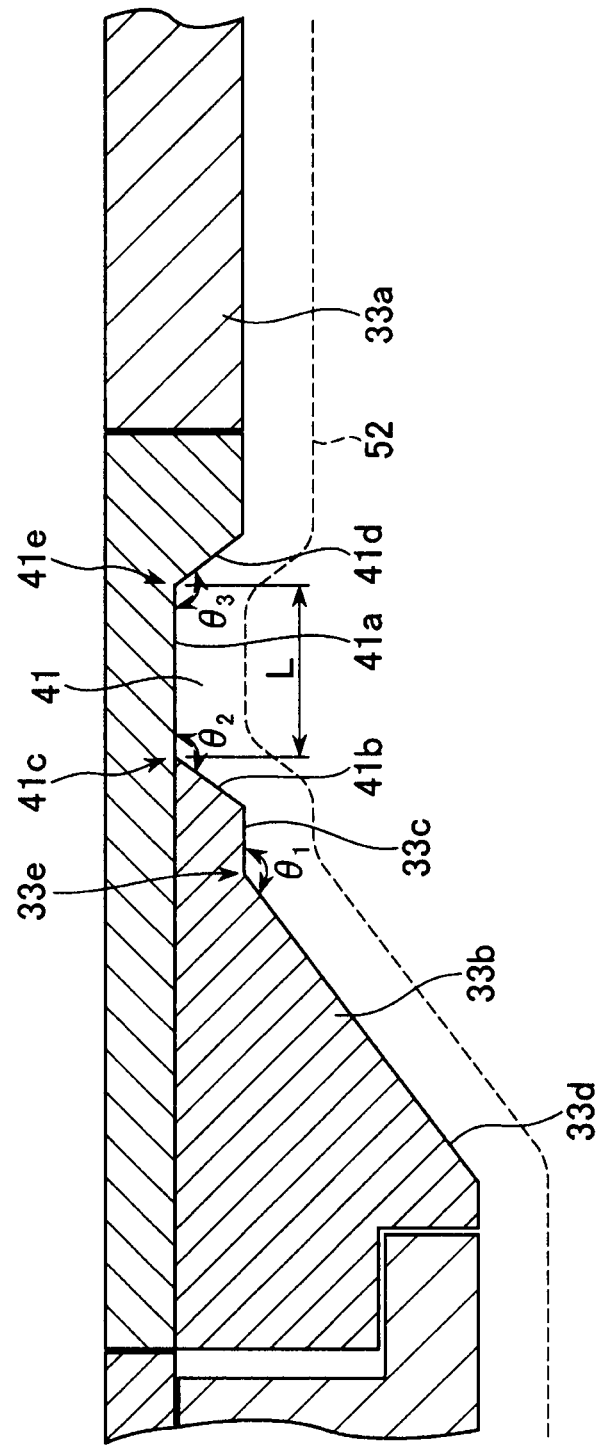
FIG. 4 is an enlarged cross sectional view schematically illustrating the structure including the outer electrode shown in FIG. 1.

FIG. 4 is an enlarged cross sectional view schematically illustrating the structure including the outer electrode shown in FIG. 1.

As shown in FIG. 4, an angle $\theta_1$ of a corner 33e formed by an inner peripheral portion 33c and an inclined surface 33d is set to be 140 degrees. An angle $\theta_2$ of a corner 41c formed by a bottom surface 41a and an inclined surface 41b of a groove 41 is set to be 125 degrees. Also, an angle $\theta_3$ of a corner 41e formed by the bottom surface 41a and an inclined surface 41d of the groove 41 is set to be 125 degrees.

Figure 5A:
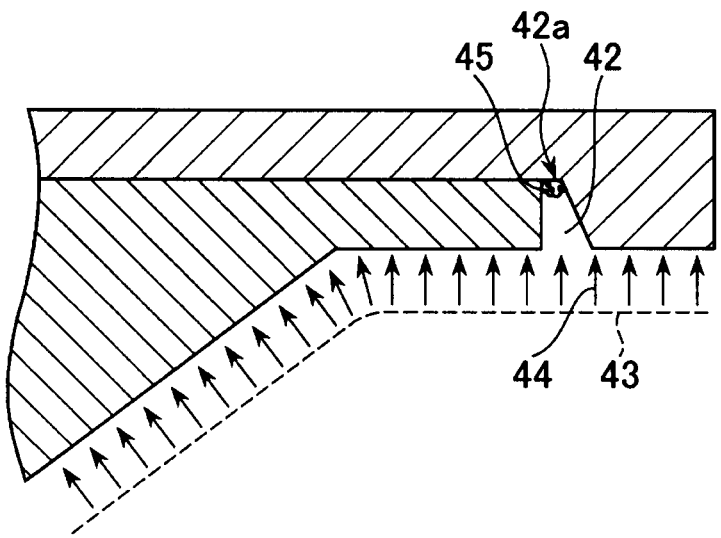

As described above, the sheath is generated along the surface of the constituent part exposed to the plasma. In a case where the constituent part such as the outer electrode 33b has a groove, however, a sheath 43 does not enter into the groove 42 when the width of the groove 42 is extremely small as shown in FIG. 5A. As a result, the distance between a bottom surface 42a of the groove 42 and the sheath 43 is increased, and the velocity of ions 44 implanted into the groove 42 from the sheath 43 is decreased. Thus, the ions 44 may not reach the bottom surface 42a. At this time, since the amount of deposits 45 removed from the bottom surface 42a by ion sputtering is decreased, the deposits 45 are deposited.

Figure 5B:
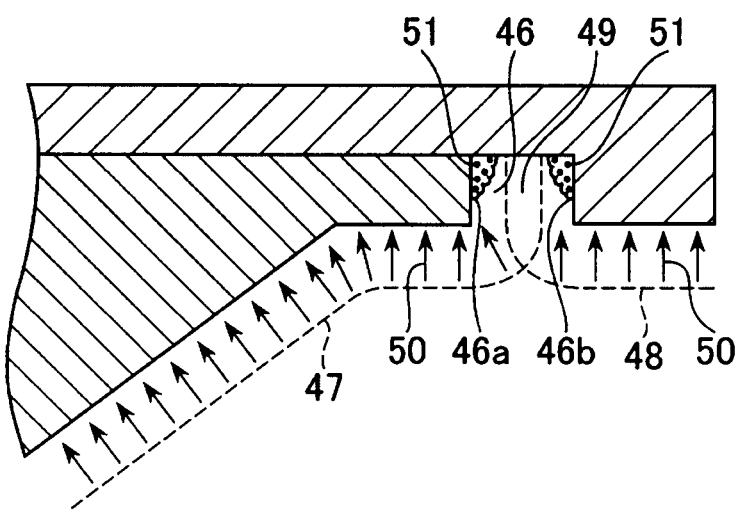

Further, when the width of a groove 46 is not very large as shown in FIG. 5B, sheaths 47 and 48 generated along both side surfaces 46a and 46b of the groove 46 may be overlapped in the groove 46. The overlapped portion of the sheaths 47 and 48 is called a hollow portion 49. The hollow portion 49 confines ions, and therefore, no ions 50 are created in the hollow portion 49. As a result, the amount of deposits removed by sputtering of the ions 50 is reduced in the groove 46, and therefore, the deposits 51 may be deposited.

In this embodiment, therefore, the minimum width of the groove 41 is set to be twice or more the thickness (length) of the sheaths. Specifically, as shown in FIG. 4, the width L of the bottom surface 41a of the groove 41 is set to be twice or more the length of the sheaths. As a result, sheaths 52 are not overlapped in the groove 41 when the sheaths 52 are generated along the inclined surface 41b and the inclined surface 41d of the groove 41.

When a DC voltage is applied to the upper electrode 33 as in the plasma processing apparatus 10, the length of the sheath generated along the surface of the upper electrode 33 is represented by Eq. 1:

$$\text{Length of sheath} = 0.606 \times \text{Debye length} \times (2 \times V_{dc}/T_e)^{3/4} \text{ (mm)} \quad \text{Eq. 1,}$$

where Vdc is a value (V) of DC voltage applied to the upper electrode 33, Te is the temperature of electrons (eV), Debye length is $7.43 \times 10^3 \times (T_e/N_e)^{1/2}$ (mm), and Ne is the density of electrons.

Figure 6:
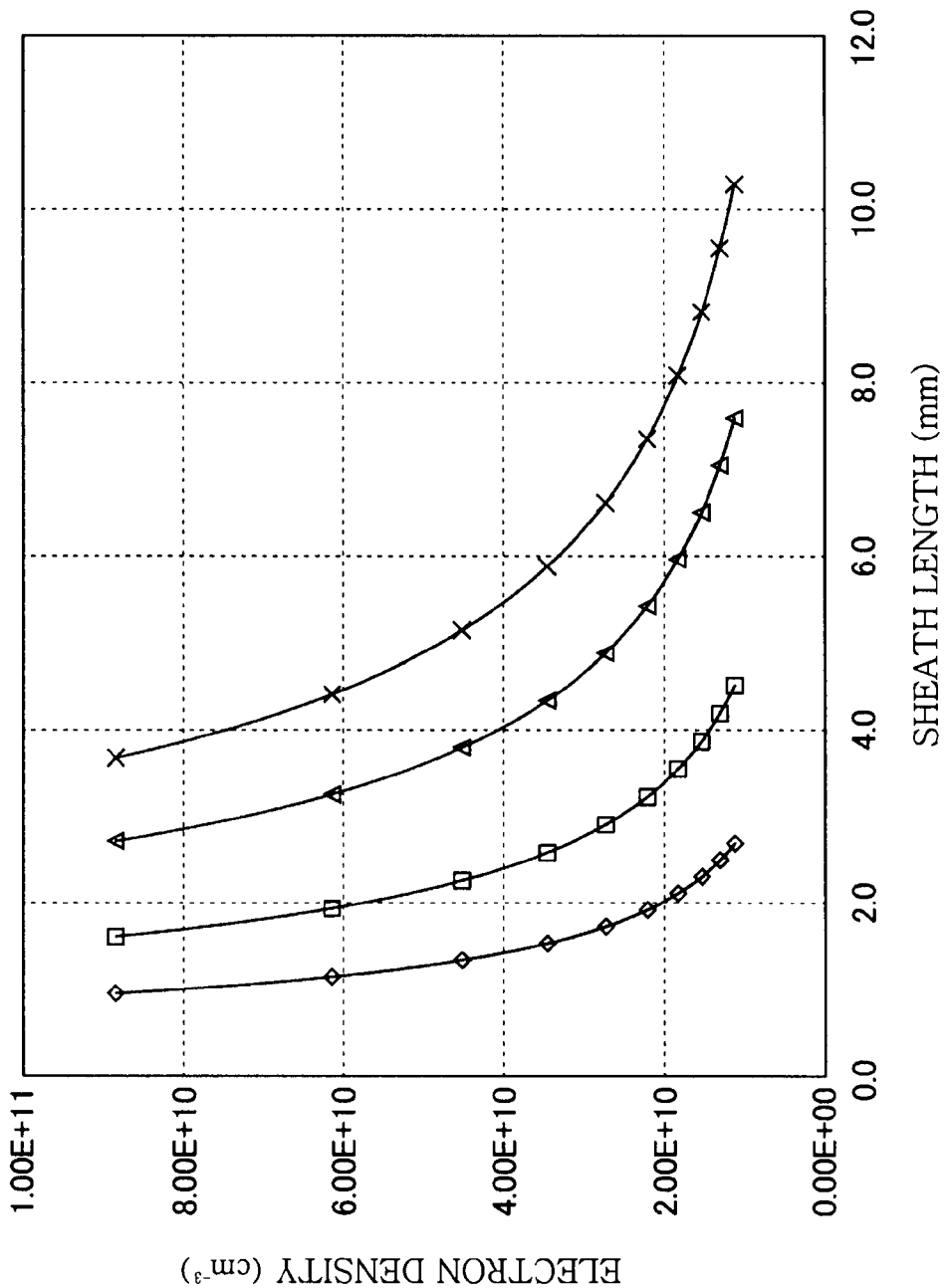
FIG. 6 is a graph illustrating a relationship between the density of electrons in a plasma and the length of a sheath generated along the surface of an upper electrode when a DC voltage is applied to the upper electrode.
Figure 7A:
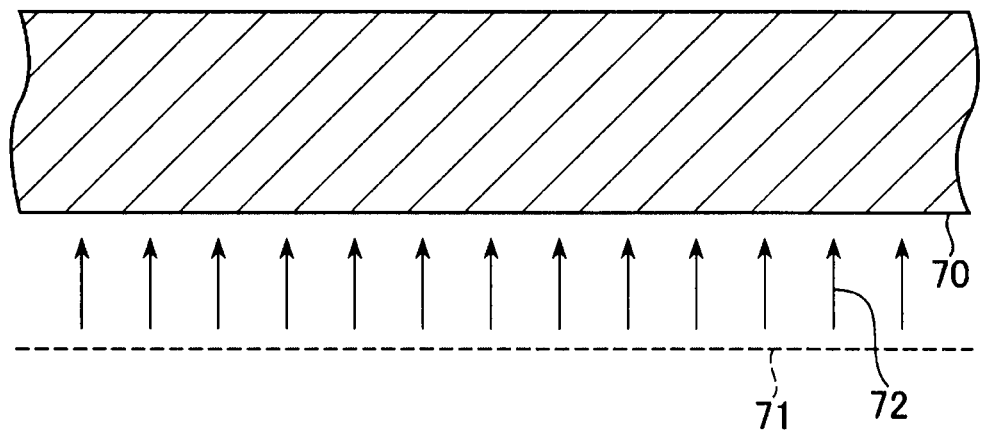
Figure 7B:
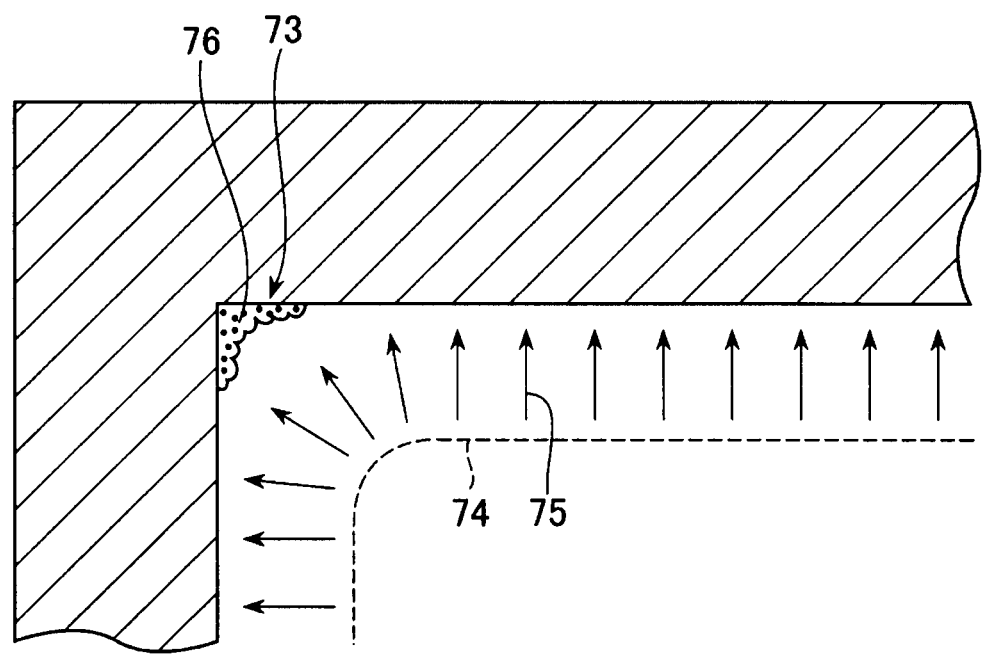

FIG. 6 is a graph illustrating a relationship between the density of electrons in a plasma and the length of a sheath generated along the surface of the upper electrode 33 based on the above-described Eq. 1. In FIG. 6, ◇ indicates a case where the value of DC voltage applied to the upper electrode 33 is 150 V, □ indicates a case where the value of DC voltage applied to the upper electrode 33 is 300 V, Δ indicates a case where the value of DC voltage applied to the upper electrode 33 is 600 V, and x indicates a case where the value of DC voltage applied to the upper electrode 33 is 900 V.

Generally, the value of DC voltage applied to the upper electrode 33 is 300 V or less, and the density of electrons in a plasma used during dry etching is $2.0 \times 10^{10}$ to $1.0 \times 10^{11}$ cm$^{-3}$. Accordingly, it can be seen from the graph shown in FIG. 6 that the length of a sheath assumed to be generated is 4.0 mm or less. Therefore, it is possible to surely prevent the hollow portion 49 from being generated in the groove 41 by setting the width L of the bottom surface 41a of the groove 41 to be 8 mm or more.

In the outer electrode 33b serving as the constituent part of the plasma processing apparatus in accordance with this embodiment, the angle $\theta_1$ of the corner 33e is 140 degrees, the angle $\theta_2$ of the corner 41c is 125 degrees, and the angle $\theta_3$ of the corner 41e is 125 degrees. Therefore, it is possible to suppress the reduction in amount of the deposits removed by ion sputtering, thereby preventing the deposits from being deposited at the respective corners 33e, 41c, and 41e.

In the above-described outer electrode 33b, the width of the bottom surface 41a of the groove 41 where the corners 41c and 41e are formed is twice or more the length of the sheath formed along the surface of the outer electrode 33b. Consequently, the sheaths 52 generated along the respective inclined surfaces 41b and 41d of the groove 41 are not overlapped although the sheaths 52 are formed in the groove 41, so that the generation of the hollow portion confining ions is prevented. As a result, it is possible to surely implant ions toward the respective inclined surfaces 41b and 41d of the groove 41 from the sheaths 52 in the groove 41 and to prevent the deposits from being deposited in the groove 41 including the corners 41c and 41e.

Although the setting of the angles of the respective corners 33e, 41c, and 41e of the upper electrode 33 and the setting of the width of the groove 41 were described in this embodiment, the present invention is applicable to other constituent parts exposed to the plasma. Specifically, it is preferable to set the angle of a corner of another constituent part or the corner formed between different constituent parts to be 125 degrees or more. In addition, it is preferable to set the width of a groove of another constituent part or a groove formed between different constituent parts to be twice or more the length of each sheath. Further, although the application of the DC voltage to the upper electrode was described in this embodiment, the present invention is applicable to a case in which no DC voltage is applied to the upper electrode. Even when no DC voltage is applied to the upper electrode, it is preferable to set the angle of each corner to be 125 degrees or more and, in addition, to set the width of the groove to be twice or more the length of each sheath.

Further, although the substrate on which the dry etching process is performed is a wafer for semiconductor devices in this embodiment, the substrate on which the dry etching process is performed may be, e.g., a glass substrate such as a liquid crystal display (LCD) or a flat panel display (FPD) without being limited to the wafer.

In the constituent part of the plasma processing apparatus and the plasma processing apparatus in accordance with the embodiments of the present invention, the constituent part may include at least one recessed corner formed by intersection of two surfaces. The recessed corner may be exposed to the plasma when the plasma is generated in the processing chamber and an intersection angle of the two surfaces seen from a plasma side may be 115 degrees to 180 degrees. Consequently, the bending degree of a sheath generated along the corner is reduced, and the diffusion of ions created from the sheath is also reduced. As a result, it is possible to prevent extreme reduction in the number of the ions implanted into the corner per unit area, thereby suppressing reduction in amount of deposits removed by ion sputtering and preventing the deposits from being deposited at the corner.

In the constituent part of the plasma processing apparatus, a groove, in which the recessed corner is formed, may have a width equivalent to twice or more a length of a sheath formed along the constituent part. Consequently, sheaths generated along respective side surfaces of the groove are not overlapped although the sheaths are formed in the groove, and the generation of a hollow portion confining ions is prevented. As a result, it is possible to surely implant ions toward the respective surfaces of the groove from the sheaths in the groove and to prevent the deposits from being deposited in the groove including the corner.

In the constituent part of the plasma processing apparatus, the width of the groove is 8 mm or more when density of electrons in the plasma is $2.0 \times 10^{10}$ to $1.0 \times 10^{11}$ cm$^{-3}$ and the DC voltage applied to the electrode which is disposed to face the susceptor is 300 V or less. Consequently, it is possible to surely prevent the deposits from being deposited in the groove of the electrode and, at the same time, to surely prevent the hollow portion from being generated in the groove.

While the invention has been shown and described with respect to the embodiments, it will be understood by those skilled in the art that various changes and modification may be made without departing from the scope of the invention as defined in the following claims.

What is claimed is:

1. A plasma processing apparatus for performing a plasma process on a substrate mounted on a susceptor by using a plasma generated in a processing chamber, the plasma processing apparatus comprising:
   an electrode disposed to face the susceptor; and
   a gas exhaust plate disposed between an inner wall of the processing chamber and a side surface of the susceptor,
   wherein the electrode includes:
   (a) a stepped structure having an inner portion and an outer portion, wherein the outer portion surrounds the inner portion and protrudes toward the susceptor beyond the inner portion, the outer portion being formed of a conductive material, and (b) a gas supply unit configured to supply a gas from a region of the inner portion, the region being disposed directly above the susceptor, wherein the outer portion includes:
  (i) a groove portion having a bottom surface, a first inclined surface, and a second inclined surface;
  (ii) a flat portion surrounding the groove portion, wherein the flat portion and the bottom surface extend parallel to a mounting surface of the susceptor which is configured to mount thereon the substrate;
  (iii) an oblique surface obliquely extending relative to the flat portion;
  (iv) a first corner formed by an intersection of the flat portion and the oblique surface;
  (v) a second corner formed by an intersection of the first inclined surface and the bottom surface; and
  (vi) a third corner formed by an intersection of the bottom surface and the second inclined surface,
wherein each of the first corner, the second corner, and the third corner is configured to be exposed to the plasma when the plasma is generated in the processing chamber and an intersection angle of each of the first corner, the second corner, and the third corner seen from a plasma side is greater than or equal to 125 degrees and smaller than 180 degrees,
wherein the gas supply unit is not included in the outer portion of the electrode,
wherein each of the first corner, the second corner, and the third corner is disposed directly above the gas exhaust plate, and
wherein the groove portion has a width equivalent to twice or more of a length of a sheath formed along the outer portion.

2. The plasma processing apparatus of claim 1, wherein the electrode is configured such that a DC voltage is applied thereto, and the width of the groove portion is 8 mm or more when density of electrons in the plasma is $2.0 \times 10^{10}$ to $1.0 \times 10^{11}$ $cm^{-3}$ and the DC voltage applied to the electrode is 300 V or less.

3. The plasma processing apparatus of claim 1, wherein the oblique surface is directed toward a peripheral portion of the substrate mounted on the susceptor.

* * * * *